United States Patent
Buch et al.

(10) Patent No.: US 6,933,864 B1
(45) Date of Patent: Aug. 23, 2005

(54) ENCODING METHOD USING CODE CONSTRAINT VIOLATION POINTERS

(75) Inventors: Bruce Buch, Westborough, MA (US); Ara Patapoutian, Westborough, MA (US)

(73) Assignee: Maxtor Corporation, Longmont, CO (US)

(*) Notice: Subject to any disclaimer, the term of this patent is extended or adjusted under 35 U.S.C. 154(b) by 0 days.

(21) Appl. No.: 10/694,328

(22) Filed: Oct. 27, 2003

Related U.S. Application Data

(60) Provisional application No. 60/424,584, filed on Nov. 7, 2002.

(51) Int. Cl.[7] ............................................. H03M 7/00
(52) U.S. Cl. ......................................... 341/59; 341/50
(58) Field of Search .............................. 341/59, 50, 51, 341/65, 67; 794/394

(56) References Cited

U.S. PATENT DOCUMENTS

| | | | | |
|---|---|---|---|---|
| 4,488,142 A | * | 12/1984 | Franaszek | 341/59 |
| 6,130,629 A | * | 10/2000 | Aziz et al. | 341/50 |
| 6,195,025 B1 | * | 2/2001 | Hassner et al. | 341/59 |
| 6,404,355 B1 | | 6/2002 | Coene | |
| 6,417,788 B1 | | 7/2002 | McEwen et al. | |
| 6,531,968 B2 | | 3/2003 | Ahn et al. | |

* cited by examiner

*Primary Examiner*—Peguy Jeanpierre
*Assistant Examiner*—Joseph Lauture
(74) *Attorney, Agent, or Firm*—Cesari and McKenna, LLP

(57) ABSTRACT

A pointer-based modulation coding method and apparatus are presented. The pointer-based modulation coding operates to produce, from an unconstrained data stream of data blocks to be delivered to a data channel, a constrained data stream which satisfies a code constraint of the data channel. The pointer-based modulation coding replaces code constraint violating bit sequences occurring in each data block with values that form a linked list in such data block.

29 Claims, 14 Drawing Sheets

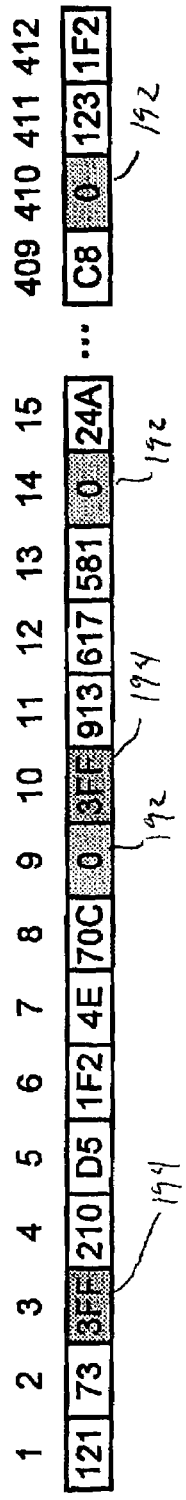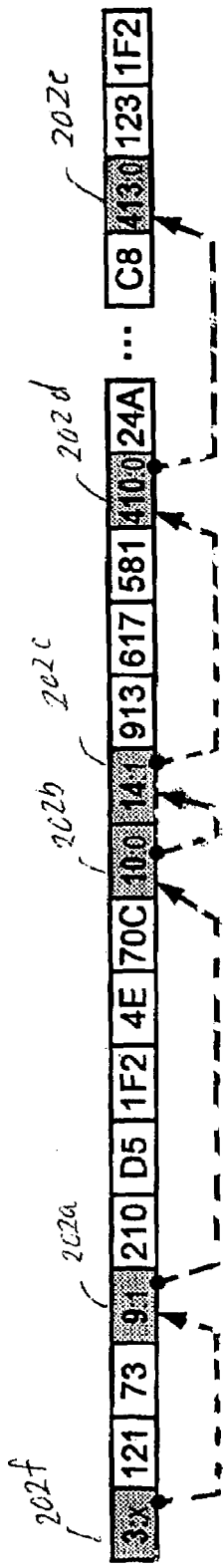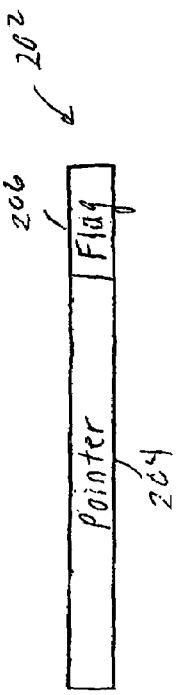

US 6,933,864 B1

ENCODING METHOD USING CODE CONSTRAINT VIOLATION POINTERS

CROSS REFERENCE TO RELATED APPLICATIONS

This application claims priority from U.S. Provisional Patent Application No. 60/424,584, filed Nov. 7, 2002, which is incorporated herein by reference in its entirety for all purposes.

BACKGROUND

The invention relates to modulation coding in data transmissions systems.

The transmission of digital information through a channel of a system such as a data storage system often requires the mapping of an unconstrained sequence of user information bits to a coded representation which is constrained to bit sequences with characteristics needed by the channel for reliable transmission. For example, in channels in which a bit clock is derived from the data stream itself, some minimum number of bit transitions are required in a window of transmitted bits to provide timing information for clock extraction. The maximum number of consecutive like bits allowed between bit transitions is referred to as the "k constraint".

One conventional encoding scheme maps vectors of contiguous unencoded data bits to somewhat longer vectors of coded data. This mapping thus uses a longer vector to represent the uncoded data while at the same time avoiding the use of bit sequences that violate the constraints of the channel.

Another approach "scrambles" the data, i.e., exclusive-OR's the data with a pseudorandom number sequence, and uses the scrambled data otherwise unencoded. This technique relies on statistical adherence of random data to code constraints and, in the infrequent event of a coding violation, changes the data where needed to preserve code constraints.

SUMMARY

This invention features a pointer-based coding mechanism that operates to eliminate code constraint violations with enhanced coding efficiency.

In one aspect of the invention, encoding a block of data to be provided to a data channel includes (i) receiving blocks of data in an unconstrained data stream; and (ii) producing a constrained data stream to satisfy a code constraint of the data channel by replacing code constraint violating bit sequences occurring in each data block with values that form a linked list in such data block.

Particular implementations of the invention may provide one or more of the following advantages. The encoding mechanism of the present invention encodes data with minimal overhead (e.g., less than 0.25% for codeword sizes typically used in hard drives) while at the same time eliminating bit sequences from the data stream that are considered code constraint violations by the data channel. Such encoding results in a highly efficient code, reducing encoding overhead by a factor of roughly 5 to 20 over conventional encoding schemes. Consequently, because of the overhead reduction, less transfer bandwidth and storage are needed. Also, unlike techniques that inject errors to preserve code constraints, the pointer-based coding is compatible with iterative decoding schemes.

Other features and advantages of the invention will be apparent from the following detailed description, and from the claims.

BRIEF DESCRIPTION OF THE DRAWINGS

FIGS. 8A–8C illustrate a replacement symbol format to handle code constraint violation patterns that include patterns of all ones and all zeroes.

Like reference numerals will be used to represent like elements.

DETAILED DESCRIPTION

Figure 1:
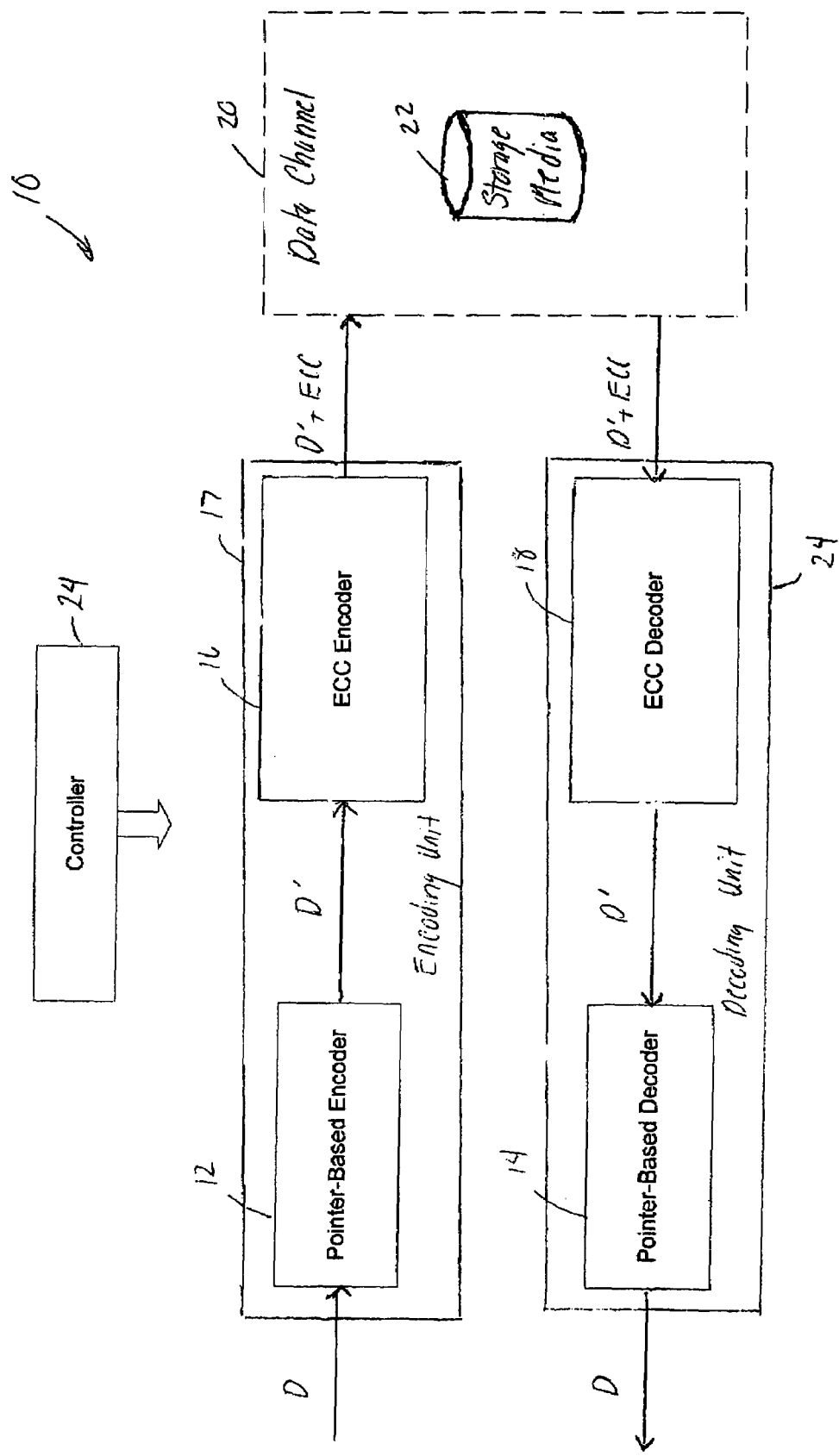
FIG. 1 is a block diagram of an encoding/decoding system that employs a pointer-based encoder and decoder.

Referring to FIG. 1, an exemplary system 10 employs a modulation encoder implemented as pointer-based encoder 12 and modulation decoder implemented as a pointer-based decoder 14. The system 10 also includes an error correction code (ECC) encoder 16 and an ECC decoder 18. A stream of unconstrained user data bits (D), for example, a block of data, is received by the pointer-based encoder 12, which encodes the data and provides the pointer-encoded data (D') to the ECC encoder 16. The pointer-encoded data D' is "constrained" data, that is, a sequence of bits that satisfies at least one type of code constraint, as discussed later. Collectively, encoders 12, 16 are represented as an encoding unit 17. The ECC encoder 16 generates from the pointer-encoded data D' an ECC codeword (D'+ECC) and provides the codeword to a data channel 20. The ECC redundancy bits may be appended to the pointer-encoded data D' or interspersed with the pointer-encoded data D'. The data channel 20 may include, for example, storage media 22 such as magnetic recording media. When the codeword is received from the data channel 20, for example, during a readback or receive operation, the ECC decoder 18 performs an ECC decoding operation on the codeword as received from the data channel 20 to produce the pointer-encoded data D', which it then provides to the pointer-based decoder 14. Collectively, decoders 14, 18 are represented as a decoding unit 24. The pointer-based decoder 14 decodes D', thus restoring D' to the original user data D. The functional units 12, 14, 16 and 18 are operated under the control of a system controller 24, which provides the appropriate timing and other control signals to these units.

The details of the pointer-based coding will be described within the context of a storage device data channel, such as a hard drive data channel. Accordingly, for illustrative purposes, parameters typical of a hard drive data channel are considered. It will be understood, however, that the pointer-based coding may be used in any type of data transmission system, including a communications system, which uses encoding for data transmission.

In general, as with conventional modulation encoding/decoding approaches, the modulation encoding/decoding of the units 12, 14 ensure that each codeword received from a data channel complies with any code constraints of the system. In a magnetic recording application, for example, one code constraint known as the k constraint dictates the maximum number of consecutive like bits allowed between bit transitions in a recorded data sequence. Thus, the modulation encoder 12 applies a code constraint such as the k constraint to the unconstrained sequence of user data D to produce the constrained sequence D'. In the case of the k constraint, the resulting constrained data sequence guarantees that a change in the readback waveform will occur at regular intervals for the purpose of synchronizing a phase locked loop to the data. Typically, bit patterns consisting of runs of all zeroes or runs of all ones are considered k constraint violations because they do not provide the necessary transitions from which timing information can be recovered. Other patterns can be problematic for timing recovery as well. For example, it may be desirable to impose a constraint that ensures a minimum number of consecutive like bits (that is, a minimum physical spacing) between bit transitions. A Nyquist pattern of alternating 0's and 1's (as well as the inverse Nyquist pattern of alternating 1's and 0's) would violate such a constraint. The term "code constraint", as used herein, refers to any and all such constraints of a data channel.

In conventional systems, the raw data D would be first encoded by an ECC encoder, such as a Reed Solomon encoder, and the encoded data would then be modulation encoded, for example, by a Run Length Limited (RLL) encoder, to eliminate code constraint violations such as runs of zeroes (or ones) exceeding the specified code constraint. Because the code of the pointer-based modulation coding scheme of system 10 does not have good "error propagation" properties, however, it is desirable to use an ECC to protect the data after the pointer-based encoding is applied to the data. Thus, the ECC and modulation coding functions on both the encoding and decoding side are transposed, that is, the pointer-based encoding occurs prior to the ECC encoding and, conversely, the pointer-based decoding follows the ECC decoding, as shown in FIG. 1.

The term "pointer-based encoding" refers to a process of replacing symbols in the unconstrained user data D that violate any code constraints (referred to herein as "code-violating symbols") with pointers whose values do comply with such code constraints. The term "pointer-based decoding" refers to a process of restoring the original data.

During pointer-based encoding, the pointer-based encoder 12 parses symbols of an input data stream (e.g., a block of data) and replaces those symbols that qualify as code constraint violations with pointer symbols. The pointers in the pointer symbols form a linked list of symbol locations that originally contained code constraint violations. In the illustrated embodiment, the code constraint or code constraints of interest include the k constraint, as discussed earlier. During pointer-based decoding, the pointer-based decoder 14 deconstructs the linked list and restores the encoded block or codeword to the original data by replacing each pointer with the value of the original code-violating symbol. A distinguishing feature of the pointer-based modulation coding, therefore, is the threading of a linked list into a data block to implicitly represent replaced values. That is, the original value of replaced symbols is implied by their inclusion in the linked list. Symbols that are not included in the linked list are interpreted literally. The linked list produced by the pointer-based encoder 12 is also referred to herein as a "code violation pointer list".

The bits in a data block are grouped into n-bit symbols. In the described embodiment, the value of n is defined to be 10, but other values (symbol sizes) may be used. Historically, the symbol grouping has been driven by the symbol size of a companion Reed-Solomon ECC implementation; however, even if a non-symbol-oriented ECC strategy is used, a demarcation of the data stream into symbols can be used to facilitate the pointer-based modulation encoding/decoding solution described herein. The k constraint that results from a basic application of the pointer-based encoding scheme to a 10-bit symbol is 18.

Figure 2:
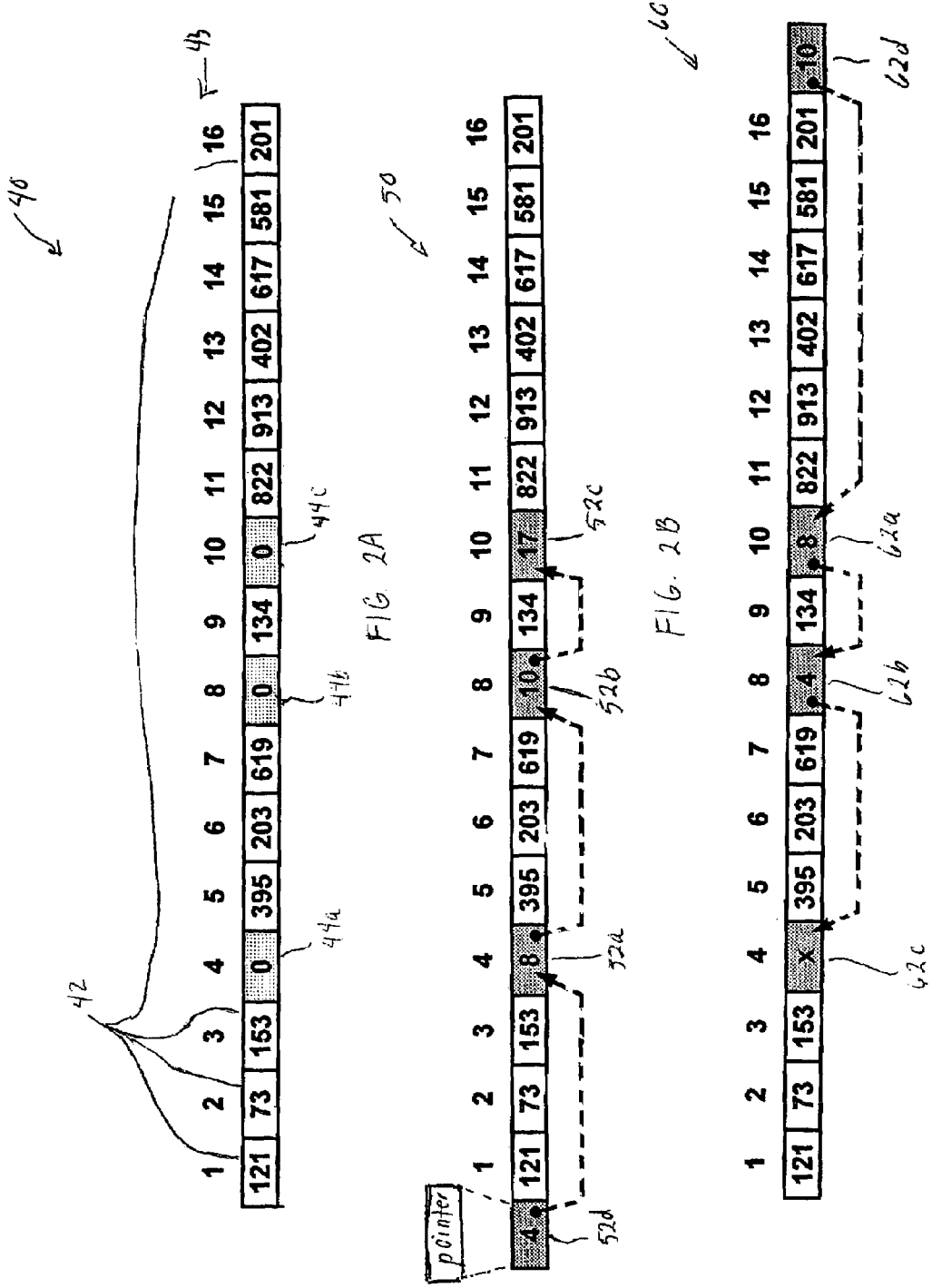
FIG. 2A shows an original block of data prior to encoding by the pointer-based encoder.
FIG. 2B shows the encoded data block (of FIG. 2A) after "forward list" encoding by the pointer-based encoder.
FIG. 2C shows the encoded data block (of FIG. 2A) after "reverse list" encoding by the pointer-based encoder.

The pointer-based encoding can operate to produce either a forward pointing code-violation pointer list (or "forward list") or a backward pointing code-violation pointer list (or "reverse list"). FIGS. 2A–2C illustrate a block of data prior to pointer-based encoding (FIG. 2A) and after pointer-based encoding using "forward list" encoding (FIG. 2B) or, alternatively, using "reverse list" encoding (FIG. 2C), by the pointer-based encoder 12. In these and other figures, the data symbols of the input stream may be represented by S[1], S[2], S[3], . . . S[L] for L data symbols, where the numbers in brackets are indices. Thus, for example, the index 43 for symbol S[16] is 16.

Referring to FIG. 2A, an example of an unencoded (or "unconstrained") data block 40 is shown. The data block 40 includes symbols 42, corresponding to indices 43. Some of the symbols 42 are code constraint violating symbols, shown here as three "all zero" vectors, indicated by reference numerals 44a, 44b and 44c. Although the symbols 44 are "all zero" vectors, they could contain some other k constraint violating bit pattern, such as "all ones", or other code constraint patterns such as Nyquist vectors, as will be discussed later. Also, the data block could contain any number of these code-violating symbols 44.

Referring to FIG. 2B, after forward list pointer-based encoding, an encoded version of the data block shown in FIG. 2A, that is, codeword 50, includes pointers (or pointer symbols) 52 that form a forward list. In the forward list, the pointers 52 point forward in the list to symbols later in the data stream (as indicated by the dashed arrows). In the example shown, the pointers 52 include pointer 52a, a replacement symbol for S[4], pointer 52b, a replacement symbol for S[8] and pointer 52c, a replacement symbol for symbol S[10]. The pointer 52a in S[4] points to S[8] and the pointer 52b in S[8] points to S[10], which contains an end-of-list pointer. The codeword 50 also includes a head-of-list pointer 52d that, unlike the other pointers, does not replace a code violating symbol but rather points to the first replacement symbol (in the example, S[4]) in the list. The pointer 52d is prepended to the first symbol S[1] by the pointer-based encoder 12, as will be discussed in further detail with reference to FIG. 3.

Referring to FIG. 2C, after reverse list pointer-based encoding, an encoded version of the data block shown in FIG. 2A, codeword 60, includes pointers (or pointer symbols) 62 that form a reverse list. The pointers 62 in the reverse list point backwards to earlier symbols in the data stream, as indicated by the dashed arrows. In the example shown, the pointers 62 include pointer 62a, a replacement symbol for S[10], pointer 62b, a replacement symbol for S[8] and pointer 62c, a replacement symbol for symbol S[4]. The pointer 62a in S[10] points to S[8] and pointer 62b in S[8] points to S[4], which contains an end-of-list pointer. The codeword 60 includes a head-of-list pointer 62d that is appended to the last symbol S[16] and points to the first replacement symbol (in the illustrated example, S[10]).

Figure 3:
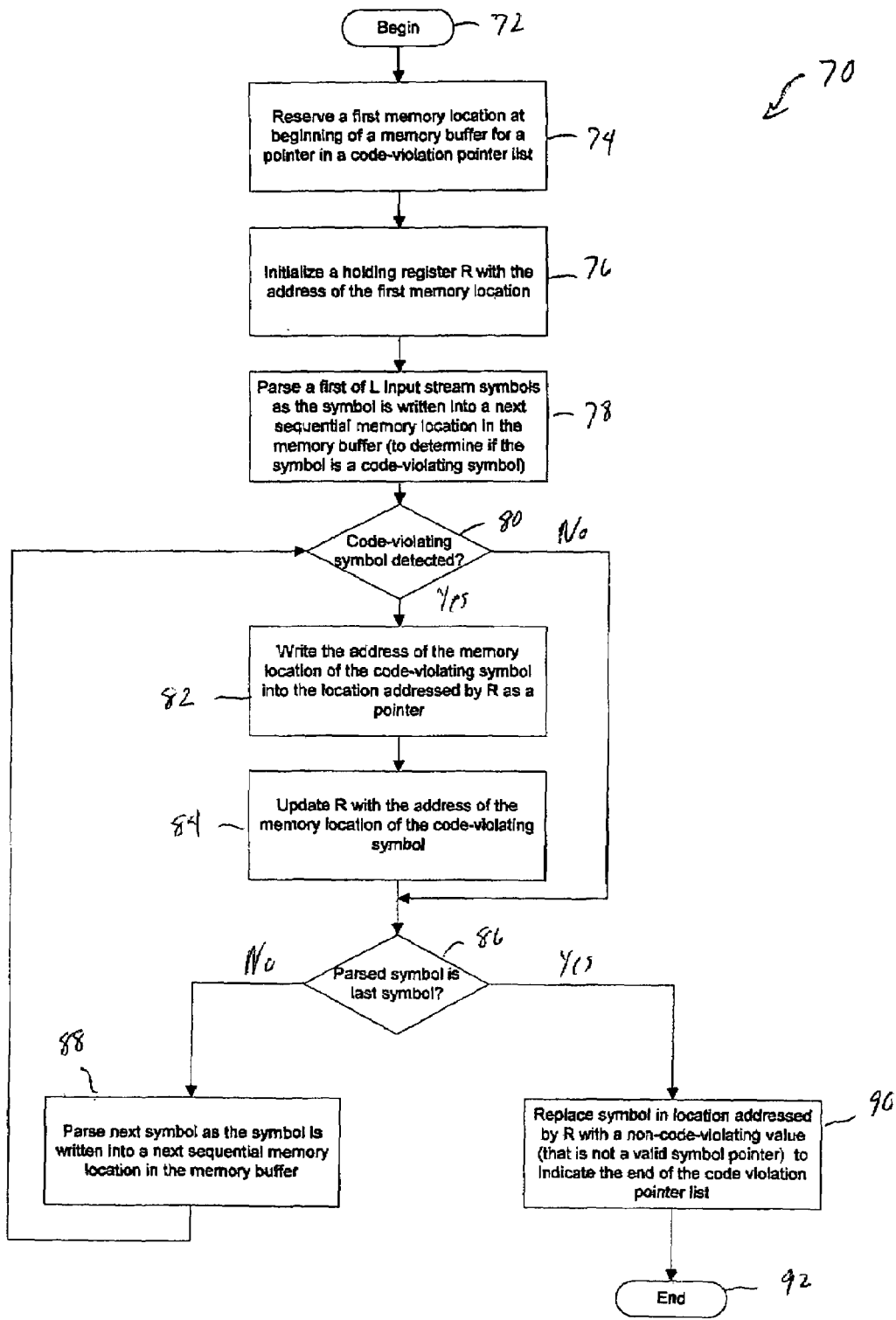
FIG. 3 is a flow diagram illustrating the operation of the pointer-based encoder for forward list encoding.

Referring to FIG. 3, an exemplary operation of the pointer-based encoder 12 for forward list encoding 70 is shown. In this figure and subsequent figures, "R" denotes a holding register used to temporarily hold memory locations or symbol indices during the pointer-based processing. The forward list encoding process 70 builds a forward-pointing code-violation pointer list on an input stream of data being received into a memory buffer. The process 70 begins (step 72) by reserving a first memory location at the beginning of the memory buffer for a first pointer in the code-violation pointer list (step 74). The process 70 initializes the holding register R with the address of the first memory location (step 76). The process 70 parses a first of L input data stream symbols as that symbol is written into a next sequential memory location in the memory buffer to determine if the symbol is a code-violating symbol (step 78). If a code-violating symbol is detected (at step 80), the process 70 writes the address of the sequential memory location (to which the symbol is written) into the location addressed by R as a pointer (step 82). The process 70 updates the register R with the memory location in which the just-received code-violating symbol was stored. Once R has been updated, or if the symbol was determined not to be a code-violating symbol (at step 80), the process 70 determines if the parsed symbol is the last symbol (step 86). If the parsed symbol is not the last symbol, the process 70 parses a next symbol in the data stream as that symbol is written into a next sequential memory location in the memory buffer (step 88) and returns to step 80. If, at step 86, the process 70 determines that it has come to the end of the data stream, the process 70 replaces the symbol in the location addressed by R with a non-code-violating symbol value to indicate the end of the list (step 90). The value of the last replacement symbol is arbitrary with the following restrictions: i) it must be a non-code-violating value; and ii) it must be a value that cannot be confused with a valid symbol pointer. It may be a special value used to confirm that the location is the end of the code-violation pointer list, for example, a pointer exceeding the highest location in the block. If the block contains no code-violating symbols, the initial pointer prefixing the block is loaded with this special value. Once the end of the list is reached, the process 70 terminates (step 92). Since each pointer is a non-code-violating value, replacing each code-violating symbol with a non-code-violating pointer achieves the goal of generating a codeword that contains only non-code-violating symbols.

Figure 4:
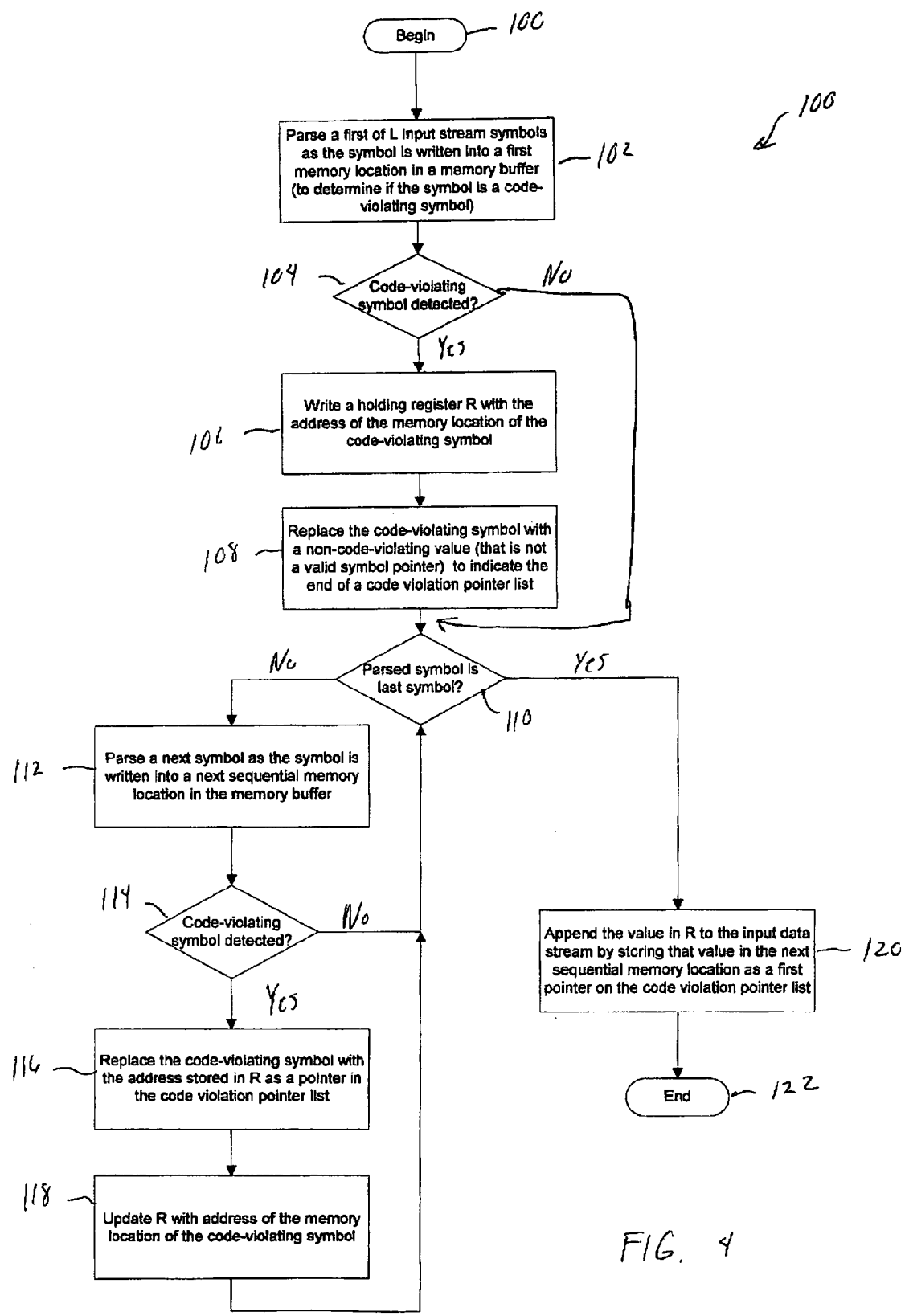
FIG. 4 is a flow diagram illustrating the operation of the pointer-based encoder for reverse list encoding.

Referring to FIG. 4, an exemplary operation of the pointer-based encoder 12 for a reverse list encoding process 100 is shown. The reverse list decoding builds a reverse-pointing code-violation pointer list on an input stream of data. Data symbols in the input stream are parsed on the fly. A counter is used to record an index n for each symbol S[n] as it is received. The process 100 begins (step 100) by parsing a first of the L input stream symbols as the symbol is written into a first memory location to determine if the symbol is a code-violating symbol (step 102). If the process 100 detects a code-violating symbol (at step 104), the process 100 writes the register R with the address of the memory location (or index) of the code-violating symbol (step 106). The process 100 replaces the code-violating symbol with a non-code-violating symbol value (that is also not a valid symbol pointer) to indicate the end of a code violation pointer list (step 108). Once that replacement is made, or if the symbol is determined not be a code-violating symbol (at step 104), the process 100 determines if the parsed symbol is the last symbol in the block (step 110). If the symbol is not the last symbol, the process 100 parses the next symbol as that symbol is written into a next sequential memory location in the memory buffer (step 112). The process 100 determines if that symbol is a code-violating symbol (step 114). If it is not, the process 100 returns to step 110 to determine if all of the symbols in the block have been processed. If, on the other hand, the symbol is determined to be code-violating symbol (at step 114), the process 100 replaces the code-violating symbol with the address stored in R as a pointer in the code violation pointer list (step 116), updates R with the address of the memory location of the code-violating symbol (step 118) and returns to step 110. At the end of the block, the value in R is appended to the data block (input data stream) by storing that value in the next sequential memory location as a first pointer on the code violation pointer list (step 120). This value therefore points to the first code-violation pointer looking backwards from the end of the data. Once the list is complete, the process 100 terminates (step 122).

Figure 5:
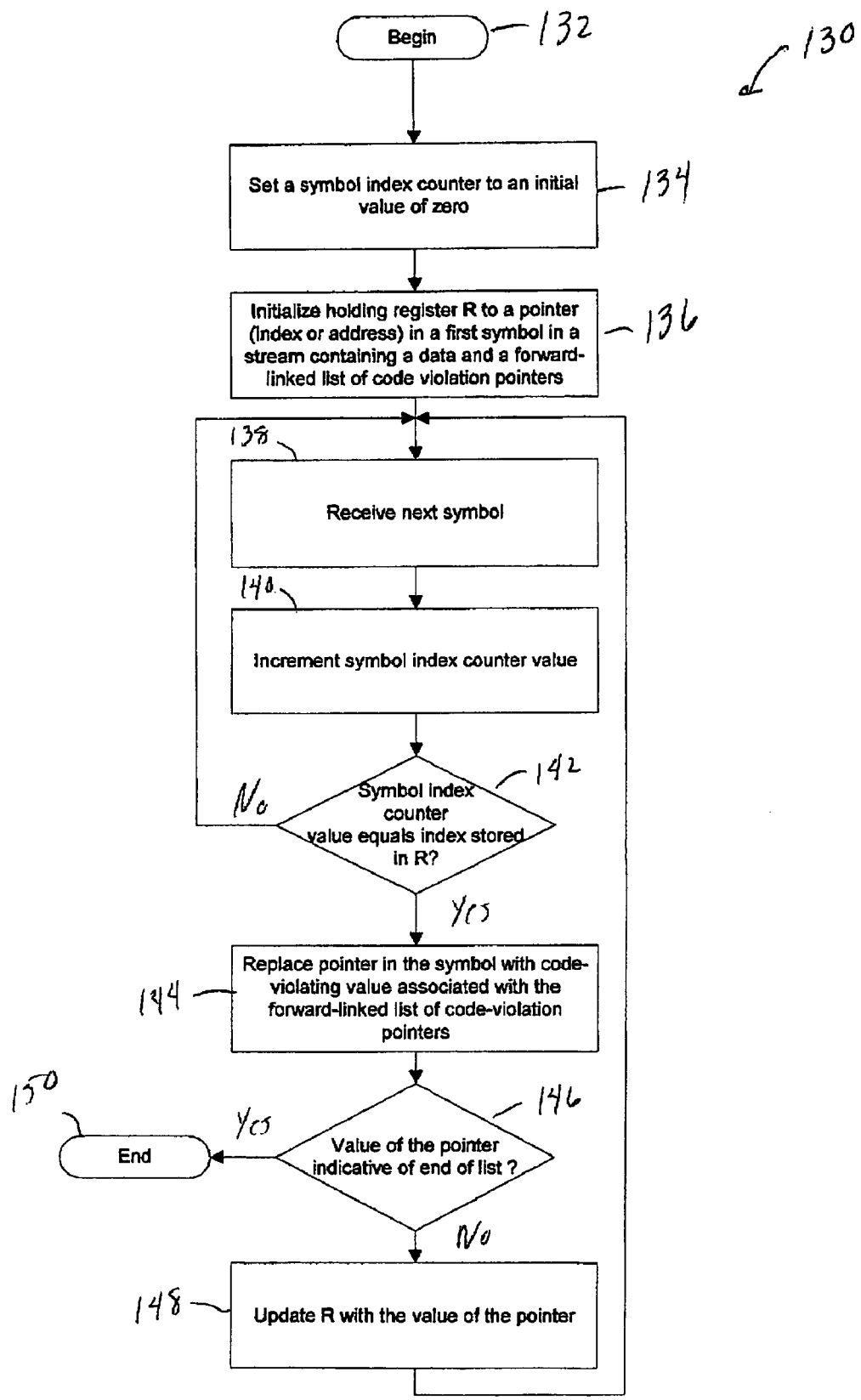
FIG. 5 is a flow diagram illustrating the operation of the pointer-based decoder for decoding a forward-list-encoded data stream.

Referring to FIG. 5, operation of the pointer-based decoder 14 for decoding a forward-list-encoded data stream ("forward list decoding process 130") is shown. The process 130 restores the original data in a codeword containing a forward-linked-list of code violation pointers. A symbol index counter is used to maintain an index for each symbol as it is received, and the symbol index counter is parsed on the fly. The process 140 begins (step 132) by initializing the symbol index counter, e.g., by setting it to an initial value of zero (step 134). The process 130 initializes a holding register R to a pointer (index or address) in a first symbol received in the stream (step 136). The process 130 receives a next symbol (step 138) and increments the symbol index counter value (step 140). The process 130 then determines if the symbol index counter value equals the index stored in R (step 142). If the counter value does not match the index stored in R, the process 130 returns to step 138 to receive the next symbol. If the counter value is equal to the index stored in R, the process 130 replaces the pointer in the symbol with the code-violating value associated with the forward-linked list of code violation pointers (that is, the code-violating symbol that was replaced by such pointer during encoding)

(step 144). The process 130 examines the value of the pointer to determined of the point indicates the end of the list (step 146). If the end of the list has not been reached, the process 130 updates R with the value of the pointer (step 148) and returns to step 138 to receive a next symbol. If the end of the list has been reached, the process 130 terminates (step 150).

Figure 6:
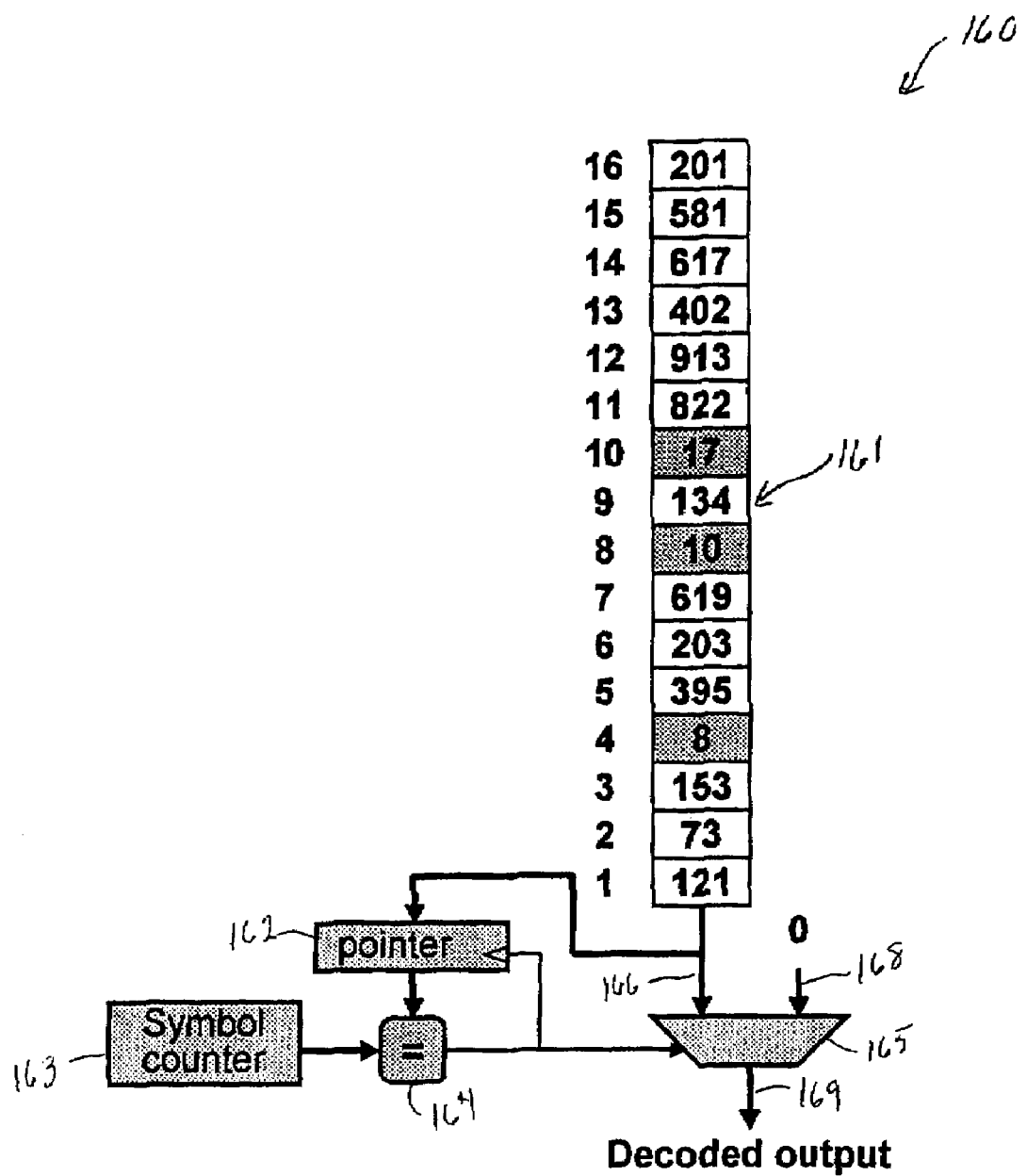
FIG. 6 is a block diagram of an exemplary implementation of the pointer-based decoder usable to decoding a forward-list-encoded data stream.

Referring to FIG. 6, in one embodiment, in which the pointer-based decoder 14 is implemented to perform a forward list decoding operation (such as process 130, as shown in FIG. 4), the pointer-based decoder 14 includes a memory buffer 161, a register "R" 162, a symbol counter 163, a comparator 164 and a decoded output selector 165. The selector 165 has two inputs, a first input 166 coupled to the memory buffer 161 to receive symbols for the data stream and a second input 168 that is set to receive the value of the code-violating symbol associated with the code-violation pointer list contained in the data stream. In the illustrated example, that code-violating symbol value is a '0' value, more specifically, a bit sequence of all zeroes. The symbol counter 163 is initialized to '0' and the register 162 is initialized to the pointer in the first symbol of the data stream. As consecutive symbols S[n] are received into sequential memory locations (shown in the figures as locations corresponding to indices 1 through 16) of the memory buffer 161, the symbol counter 163 is incremented by one so that the count value corresponds to the index n of S[n]. When the comparator 164 detects that the counter value n is equal to the value stored in the register 162, the pointer value in the data stream for S[n] is replaced with the code-violating value associated with the list being traversed. Thus, in the illustrated example, selector 165 provides the input 168 as decoded output 169. Also, register 162 is updated with the value of S[n] in the input stream. Otherwise, when the value n of the symbol counter 163 does not match contents of the register 162, the decoded output selector 165 provides the value of the symbol S[n] as the decoded output 169.

Figure 7:
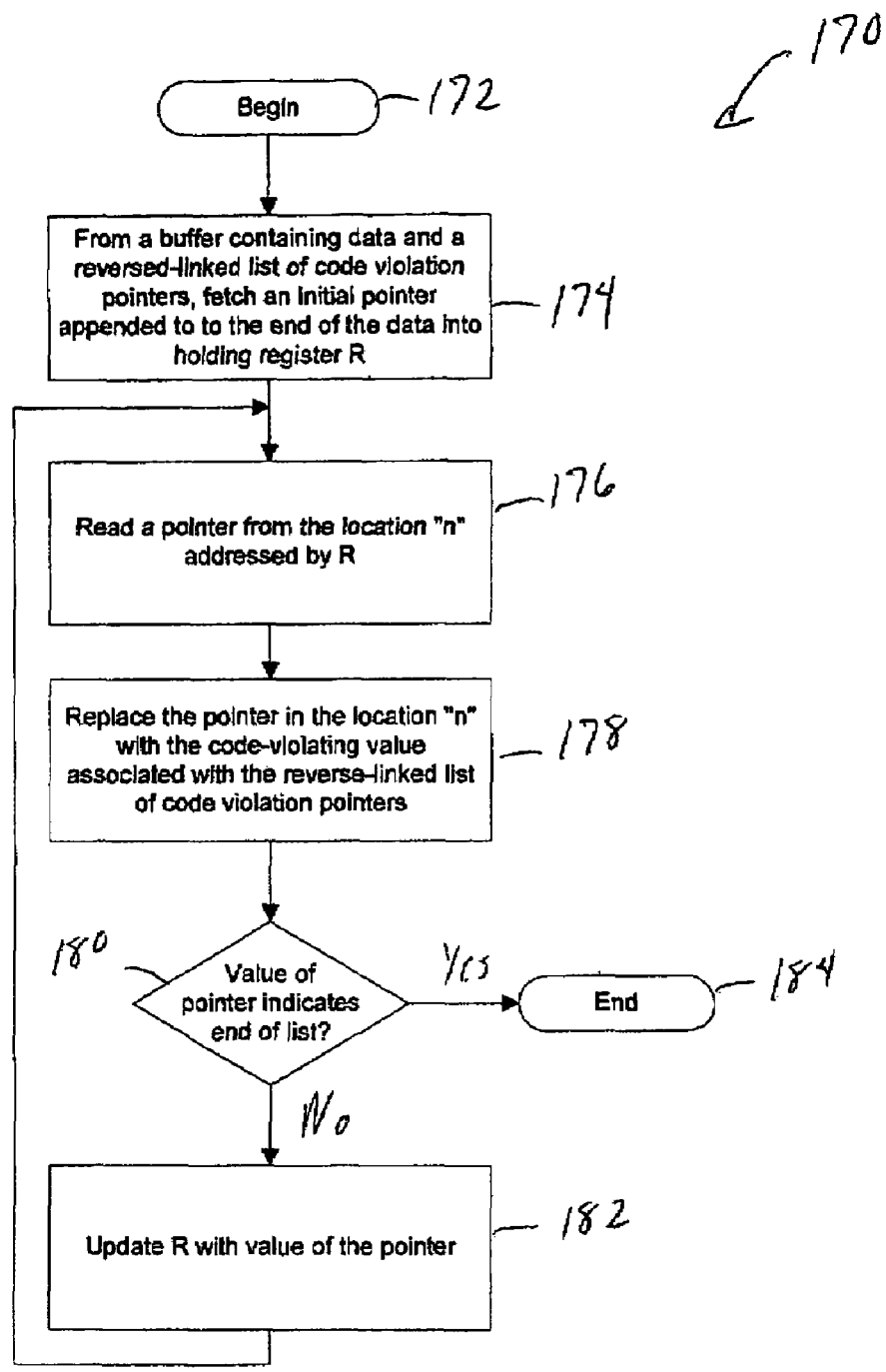
FIG. 7 is a flow diagram illustrating the operation of the pointer-based decoder for decoding a reverse-list-encoded data stream.

Referring to FIG. 7, operation of the pointer-based decoder 14 for decoding a reverse-list-encoded data stream ("reverse list decoding process 170") is shown. The reverse list decoding process 170 restores the original data in a buffer of data containing a reverse-linked-list of code violation pointers. The process 170 begins (step 172) by fetching the initial pointer n appended to the end of the data into a holding register R (step 174). The process 170 then reads a pointer from the location n addressed by R (step 176). The process 170 replaces the contents of this location with the code-violating value associated with the list being traversed (step 178). The process 170 determines if the value of the pointer indicates the end of the list (step 180), that is, is the end-of-list marker or a value that cannot correspond to a valid data symbol index. If the pointer value is not indicative of the end of the list, the process 170 updates R with the value of the pointer (step 182) and repeats steps 176, 178 and 180 until the value that is fetched at step 174 indicates an end of the list (at step 180), at which time the process 170 terminates (step 184).

It may desirable to encode to eliminate two different types of code-violating symbols. For example, as shown in FIG. 8A, a data block 190 may include symbols containing all zero vectors 192 and symbols containing all 1's ("3FF") 194. Referring to FIGS. 8B and 8C, an encoded version of the data block of FIG. 8A, codeword 200 (FIG. 8B), includes pointer symbols 202 which form a linked list (shown here as a forward list). In the illustrated example of FIG. 8B, the pointer symbols 202 include replacement symbols 202a, 202b, 202c, 202d and 202e, as well as a pointer symbol 202f that serves as the head of the list. Referring to FIG. 8C and FIG. 8B, the encoding technique used to generate codeword 200 is much the same as described earlier, except that the pointer symbols 202 are formatted to include not only a pointer 204 to point to the next such symbol but a flag 206 to identify which type of code-violating value was replaced. To support two types of code violating symbols, a single bit flag may be used. For example, the flag bit may be set to a '0' to indicate that the replaced code-violating symbol contained all 0's and set to a '1' to indicate that the replaced code-violating symbol contained all 1's. In a 10-bit symbol, the inclusion of a one-bit flag leaves 9-bits for the pointer, which is sufficient to point to any symbol of a block of up to 509 symbols, assuming two symbol values are not used (0 and 511, the all-1's value) and one symbol value (e.g., 510) is reserved for an end-of-list marker.

Figure 9A:
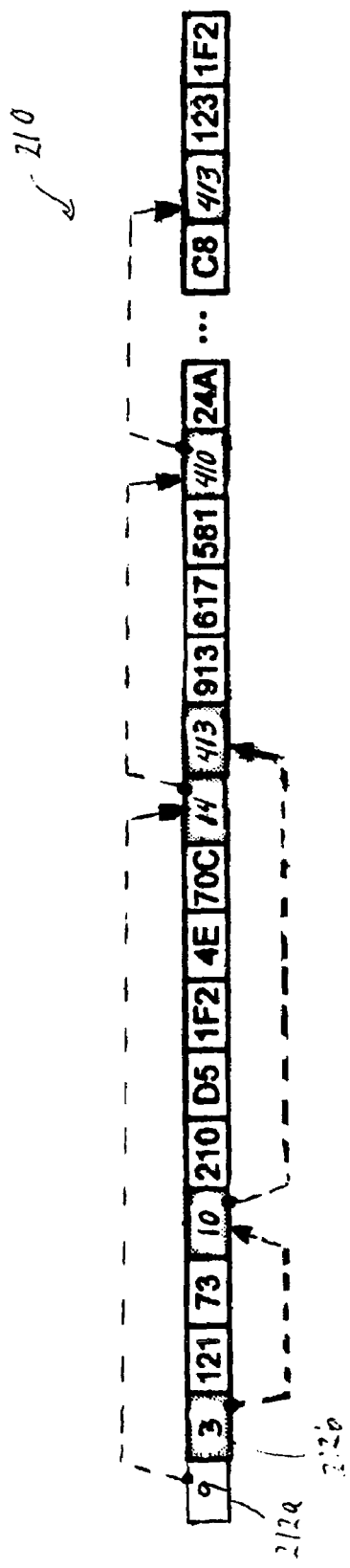
FIGS. 9A–9B illustrate linked list data structures with multiple linked lists and linked list heads to handle multiple code constraint violation patterns such as patterns of all ones and patterns of all zeroes.
Figure 9B:
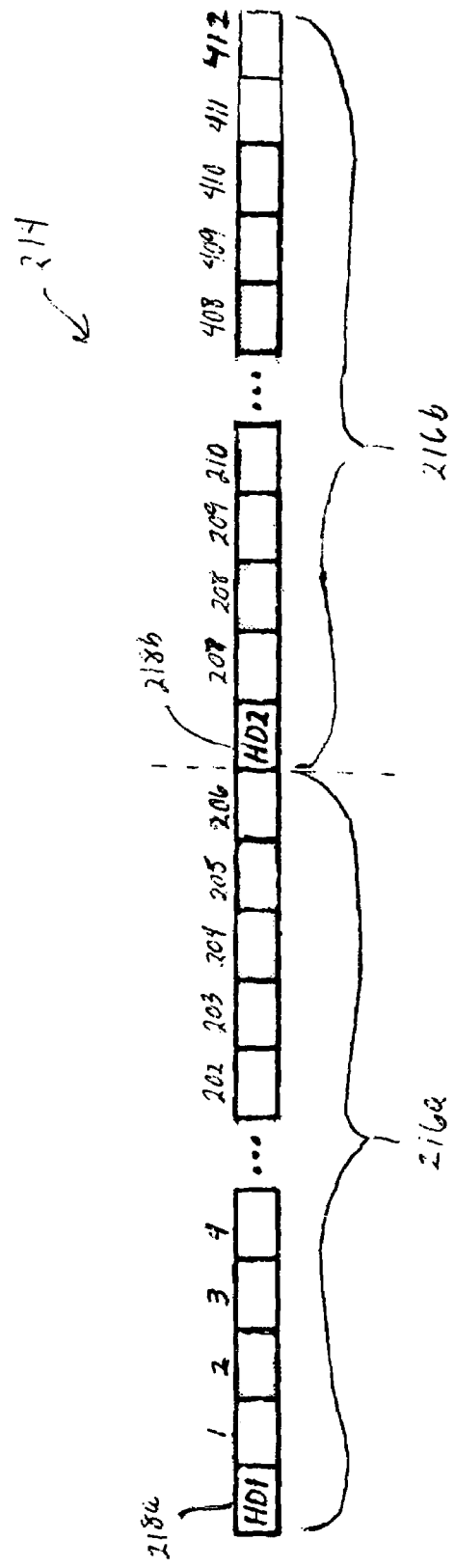

Alternatively, and referring to FIGS. 9A–9B, the encoder 12 can produce a codeword that includes a linked list data structure having two or more lists to handle code violation patterns that include at least two different code-violating symbol patterns (such as all ones and all zeroes). There are two distinct reasons for using two or more linked lists. The first would be to provide a separate list for each code constraint violating pattern. The second would be to provide the capability to point to any symbol within the data block when the symbol/pointer width is too small to hold a value large enough to point to any symbol in the data block.

In one approach, illustrated in FIG. 9A using the same data block example shown in FIG. 8A, the pointer-based encoder 12 produces an encoded data block 210 that includes separate list for each code constraint violating pattern. The pointer-base encoder 12 prefixes the data symbols and replacement symbols (of the entire data block) with two linked list heads 212a, 212b. In this approach, the linked list head 214a is used for the replacement list for one of the patterns and the linked list head 214b is used for the replacement list for the other pattern. This approach does not require the use of a flag.

In a second approach, as shown in FIG. 9B, the pointer-based encoder 12 encodes a data block to produce an encoded data block 214 having a first portion 216a containing a first linked list and a second portion 216b containing a second linked list. The first portion includes a first linked list head ("HD1") 218a that points to the first replacement symbol in the first linked list. The second portion includes a second linked list head ("HD2") 218b that points to the first replacement symbol in the second linked list. Each head and replacement symbol would include a pointer and flag, as described earlier with reference to FIGS. 8B and 8C. In the two linked list example shown in FIG. 9B, the second linked list head 218b can begin the second list mid-way through the data block. Thus, with respect to the approach illustrated in FIG. 9B, when the symbol width is too narrow to contain a pointer large enough to point to any symbol with the entire data block, new lists can be started with new list heads after some known span of symbols. In this case the pointers need only be large enough to contain the offset of each symbol from the last list head.

Figure 10:
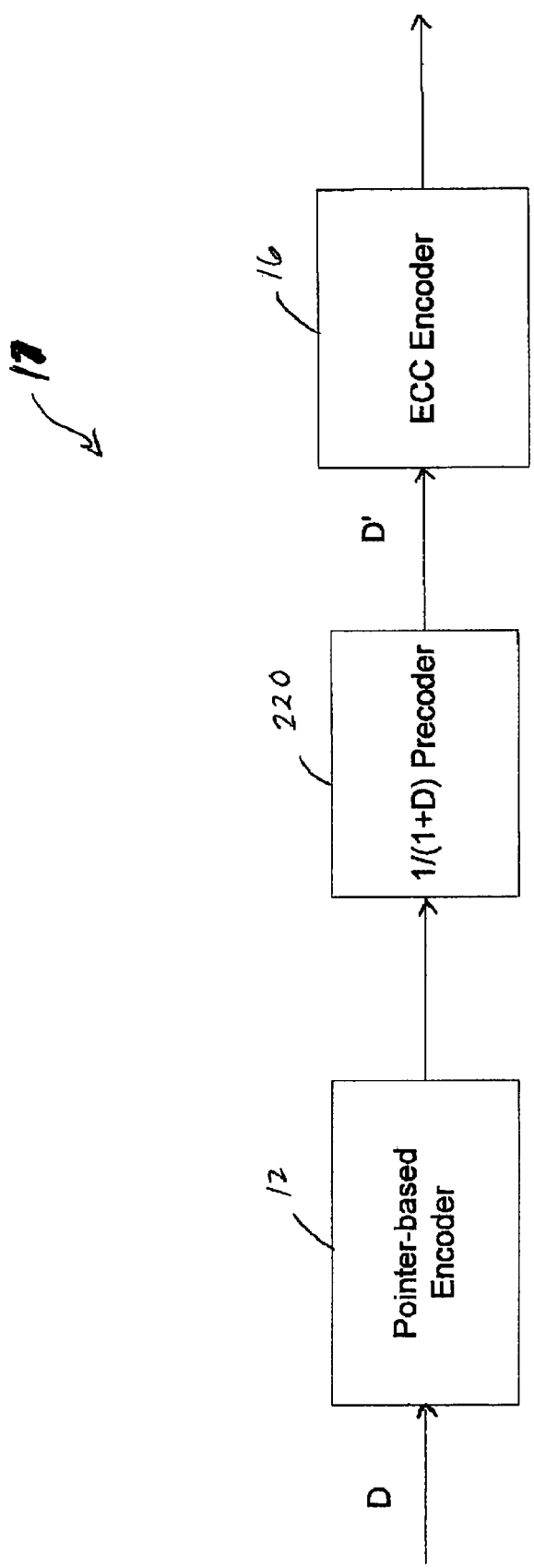
FIG. 10 illustrates use of a precoder after the pointer-based encoder to eliminate code constraint violation patterns of all ones and all zeroes.

In yet another approach to eliminating all 0's and 1's, and referring to FIG. 10, the encoding unit 17 may be implemented to include a 1/(1+D) precoder 220 between the pointer-based encoder 12 and the ECC encoder 16. In the embodiment shown, the pointer-based encoder 12 eliminates only zeroes (using the encoding technique described earlier with reference to FIG. 3 or 4). The 1/(1+D) precoder 220 encodes the results to remove the string of ones. It should be noted that the precoder 220 increases the k constraint by 1.

Figure 11:
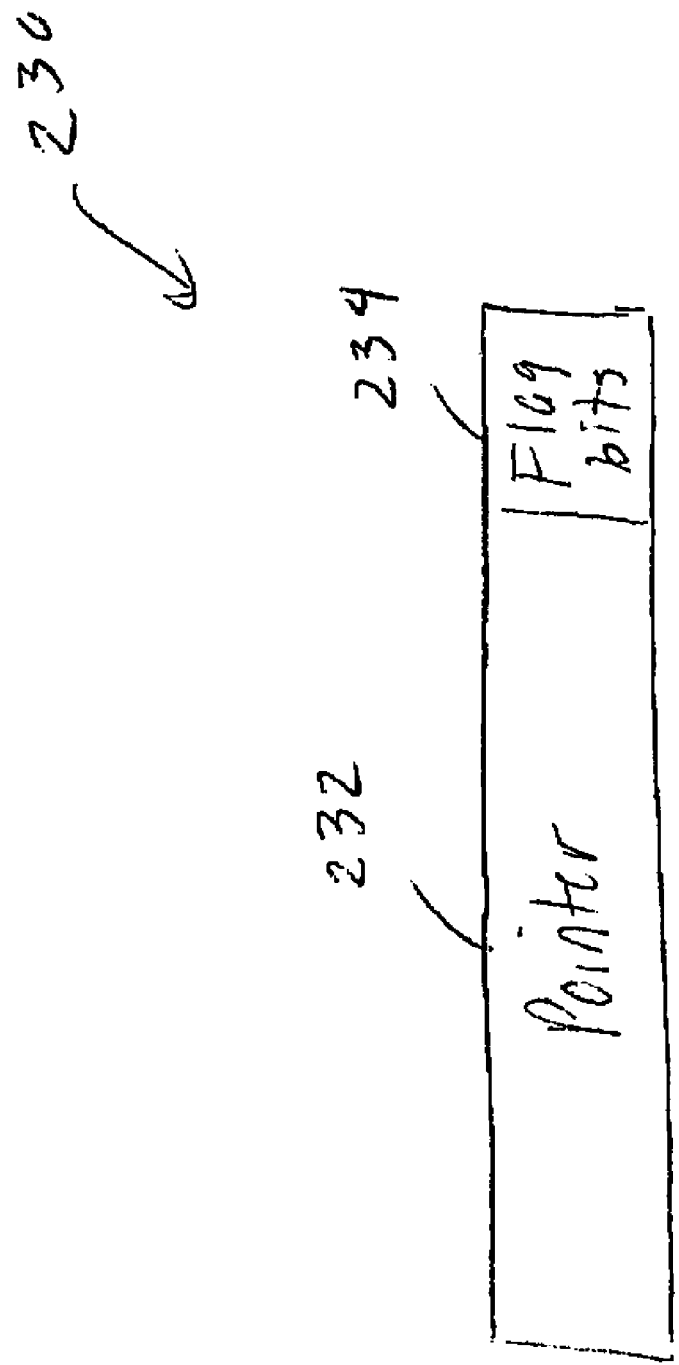
FIG. 11 illustrates a pointer/replacement symbol format usable by the pointer-based encoder to eliminate code constraint violation patterns that include patterns of all ones, all zeroes and the Nyquist vectors.

The pointer-based coding scheme may be extended further to support the elimination of additional code violation patterns. Referring now to FIG. 11, the format of a pointer symbol 230 usable by the pointer-based modulation encoder 12 to eliminate more than two code violation patterns is shown. The pointer symbol 230 includes a pointer field 232 and a flag field 234. The flag field 234 includes multiple flag bits, at least two, to support multiple code-violation patterns. In one exemplary use, two flag bits may be used to eliminate as many as four code violation patterns, including the patterns of all ones, all zeroes and the Nyquist vectors ('01010101010'and '1010101010'). In such an embodiment, the pointer-based encoder 12 operates to exclude the all-0's vector, the all-1's vector and the two Nyquist vectors from any encoded symbols. The 2-bit flag field is used to indicate which of the four code-violating patterns has been replaced.

In a 10-bit symbol implementation, the use of a 2-bit flag leaves only 8 bits for the pointer value of the pointer field 232. If this pointer size is insufficient to point to an arbitrary symbol location in a block, two separate linked lists may be used. For example, using the approach described above with reference to FIG. 9B, the pointers of the second list have an implicit offset into the second part of the block. Since the four pointer values which themselves are the code violations are reserved, and another symbol value is reserved for an end-of-list marker value, each list can span a segment of 256−5=251 symbols. The reserved pointer values can be reflected in the symbol numbering convention by simply skipping these values, and using logic to accordingly adjust any corresponding symbol-counting mechanisms.

Figure 12:
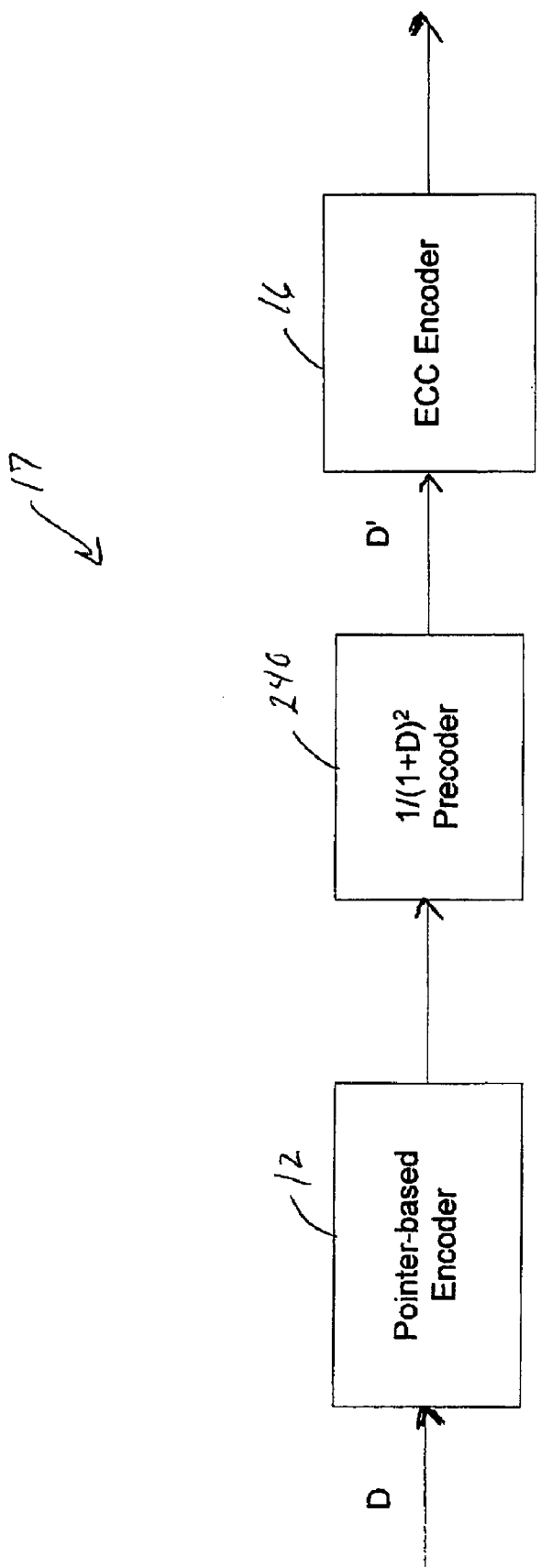
FIG. 12 illustrates use of a precoder after the pointer-based encoder to eliminate code constraint violation patterns of all ones, all zeroes and the Nyquist vectors.

An alterative to the two approaches described thus far for eliminating four code-violating patterns would be to eliminate the all zeroes pattern and encode the resulting stream with a $1/(1+D^2)$ precoder. Thus, for this solution, and referring to FIG. 12, the encoding unit 17 could be implemented to include a $1/(1+D^2)$ precoder 240 following the pointer-based encoder 12. The precoder 240 increases the k constraint by 2.

Figure 13:
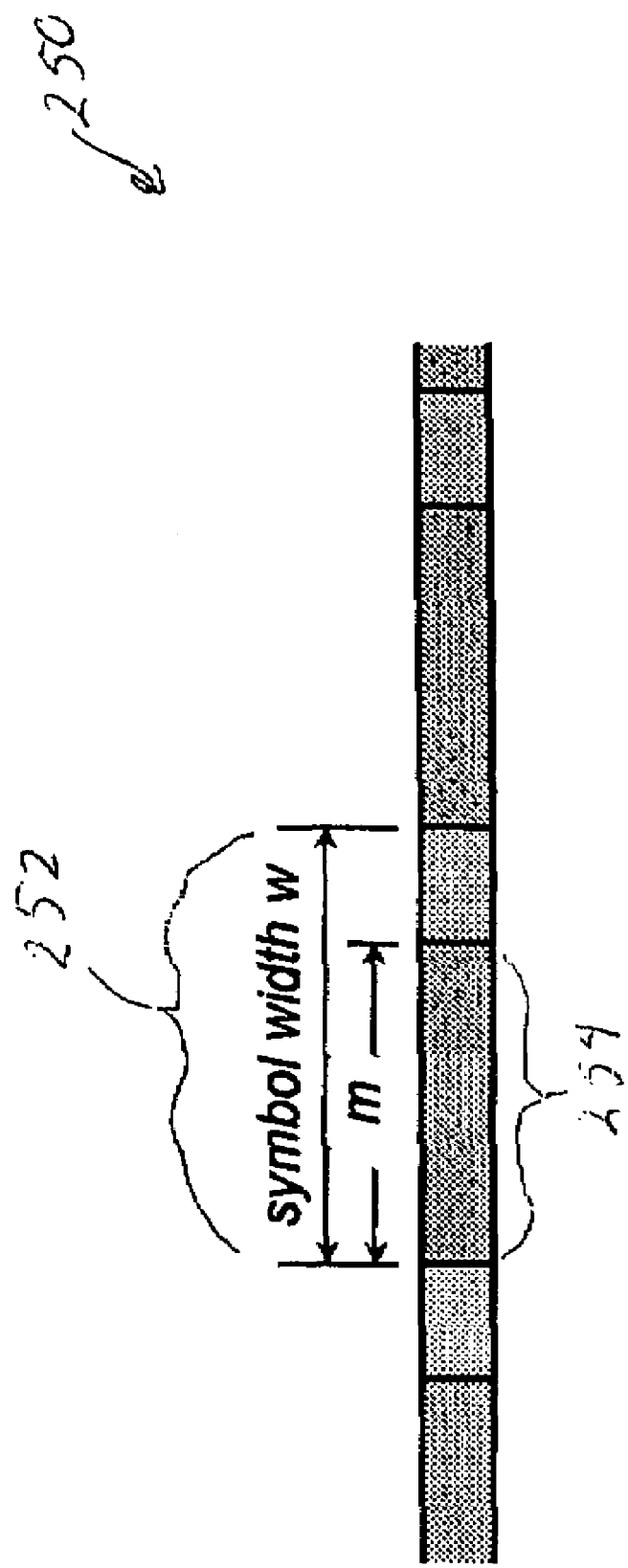
FIG. 13 illustrates an exemplary data block in which code constraint violation pattern bit sequences are shorter than the symbol size.

It is possible to enforce coding constraints over a span of bits smaller than a symbol as well. For example, as shown in FIG. 13, a data block 250 includes a symbol 252 and a code-violating pattern bit sequence 254 that is shorter than the size of the symbol 252. As before, a code violation is detected, and in turn, pointer replacement invoked for some contiguous part of the symbol of w bits 252, for example, the first m bits 254, which is a code-violating pattern. If the m-bit sequence 254 is replaced with a pointer (and possibly a violation-type-identifier flag) and the remaining w−m bits in the symbol 252 are unconstrained, the maximum run length is w+m−2. Because reduced width available for the pointers may require multiple lists for the same reasons as discussed earlier, this technique allows a trade off of code rate for coding constraint (k constraint) length. In other words, decreasing m decreases the k constraint but also introduces additional linked list heads at some point.

Figure 14:
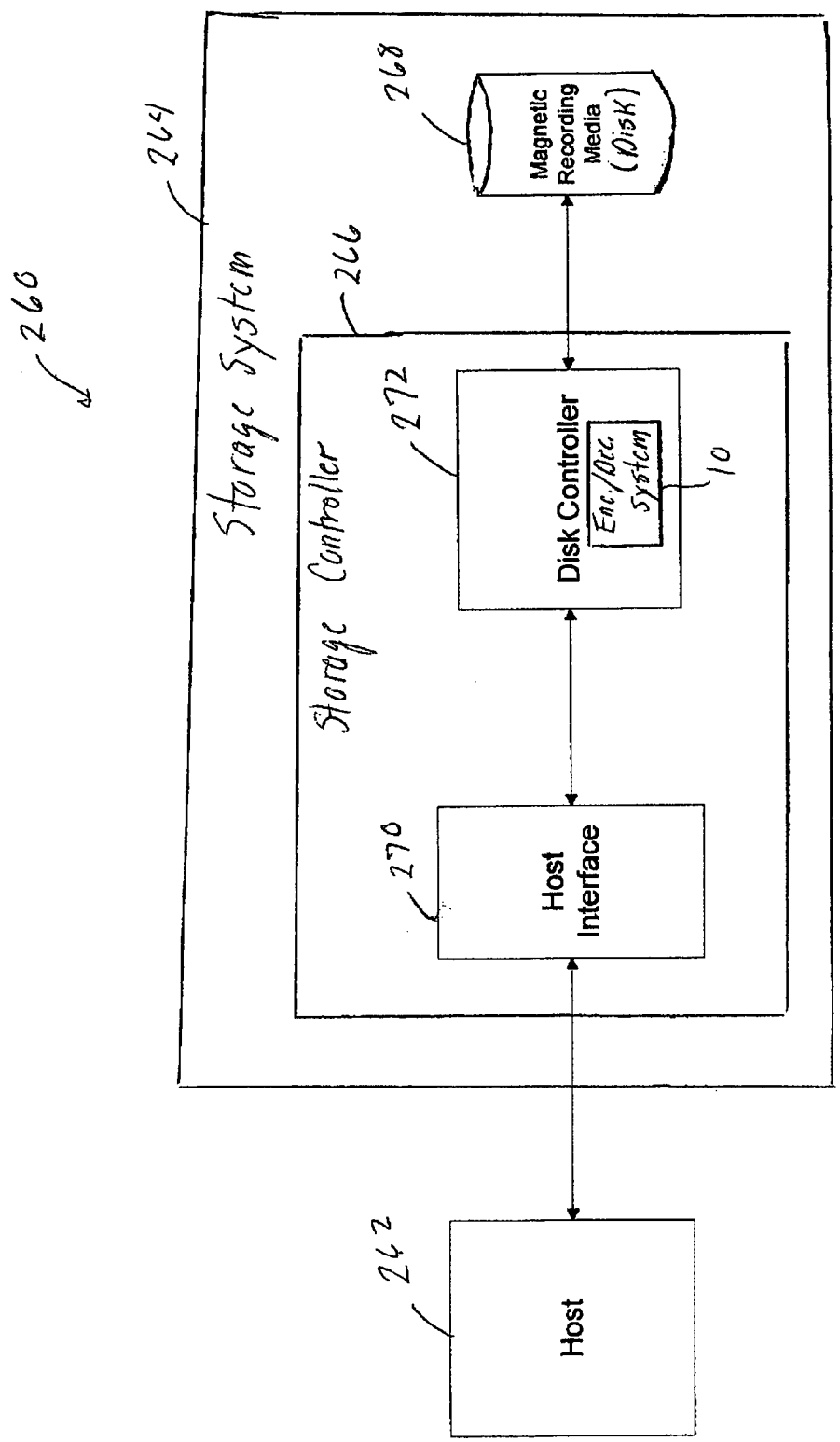
FIG. 14 is a block diagram of an exemplary data storage system that employs the encoding/decoding system of FIG. 1.

Referring to FIG. 14, an exemplary data processing system 260 that employs the encoding/decoding system 10 (FIG. 1) is shown. The data processing system 260 includes a host system or computer 262 coupled to a storage system 264. In the illustrated embodiment, the storage system is a disk drive. The storage system 264 includes a storage controller 266 coupled to a storage device, shown as a hard disk unit 268. The hard disk unit 268 is intended to represent a head disk assembly (HDA) as well as spindle, motor, actuator and other conventional drive components not included in the storage controller 266.

The storage controller 266 includes a host interface 270 that interfaces the storage controller 266 to the host system 262. The storage controller 262 also includes a disk controller 272, which is operatively coupled to the hard disk unit 268 and the host interface 270. The disk controller 272 performs a variety of drive control functions. For example, it provides the motor control and control signals to enable the HDA. The disk controller 272 includes the encoding/decoding system 10 (from FIG. 1). Data to be written to the hard disk unit 268 is provided to the encoding unit 17 of the system 10. The encoding unit 17 encodes the data and provides the data to the hard disk unit 268 via a back-end interface (not shown). During a read back operation, the decoding unit 24 provides decoded data to the host system (via the host interface 270).

The controller 24, in this embodiment, would include read/write control and servo logic, and thus provide the appropriate disk control signals to supervise the recording of data on and retrieval of data from one or more disks in the hard disk unit 268. It also provides encoder control signals to direct the encoding unit 17 to encode data written to the hard disk unit 268 and provides decoder control signals that direct the decoding unit 24 to decode the coded data as it is read back from a disk in the hard disk unit 268.

It is to be understood that while the invention has been described in conjunction with the detailed description thereof, the foregoing description is intended to illustrate and not limit the scope of the invention, which is defined by the scope of the appended claims. Other embodiments are within the scope of the following claims. All publications and references cited herein are expressly incorporated herein by reference in their entirety.

What is claimed is:

1. A method of encoding a block of data to be provided to a data channel comprising:

receiving blocks of data in an unconstrained data stream; and producing a constrained data stream to satisfy a code constraint of the data channel by replacing code constraint violating bit sequences occurring in each data block with values that include non-code-constraint-violating pointer values to form a linked list in such data block.

2. The method of claim 1 wherein the replaced code constraint violating sequences of bits include at least one type of violation of the code constraint.

3. The method of claim 2 wherein the code constraint includes a k constraint.

4. The method of claim 3 wherein the at least one type of code constraint violation includes a pattern of all zeroes.

5. The method of claim 4 wherein the data blocks in the unconstrained data sequence includes code constraint violating bit sequences comprises an all ones pattern, further comprising:

eliminating the all ones pattern of code constraint violating bit sequences from each data block using a $1/(1+D)$ precoder following the replacement of the all zeroes patterns with the linked list, wherein D is the number of bits in an unconstrained data sequence.

6. The method of claim 4 wherein the data blocks in the unconstrained data sequence include code constraint violating bit sequences which include patterns of all ones and alternating ones and zeroes, further comprising:

eliminating the patterns of all ones and alternating ones and zeroes from each data block using a $1/(1+D^2)$ precoder following the replacement of the all zeroes patterns with the linked list.

7. The method of claim 2 wherein the at least one type of code constraint violation includes a pattern of all ones.

8. The method of claim 2 wherein the at least one type of code constraint violation includes a Nyquist pattern.

9. The method of claim 2 wherein the at least one type of code constraint violation includes code constraint violations that include a first pattern and a second pattern.

10. The method of claim 9 wherein each value further includes a flag to identify if the corresponding code violating bit sequence that such value replaces is the first pattern or the second pattern.

11. The method of claim 9 wherein replacing comprises:
replacing code constraint violating bit sequences having the first pattern with values that form a first linked list; and
replacing code constraint violating bit sequences having the second pattern with values that form a second linked list.

12. The method of claim 11 wherein producing comprises:
prefixing a first sequence of bits in the data block with a first linked list head followed by a second linked list head, the first linked list head pointing to a first value in the first linked list and the second linked list head pointing to a first value in the second linked list.

13. The method of claim 9 wherein replacing comprises:
replacing, in a first portion of the data block, code constraint violating bit sequences including the first and second patterns with values that form a first linked list; and
replacing, in a second portion of the data block, code constraint violating bit sequence including the first and second patterns with values that form a second linked list.

14. The method of claim 9 wherein the first pattern corresponds to a pattern of all zeroes and the second pattern corresponds to a pattern of all ones.

15. The method of claim 2 wherein the at least one type of code constraint violation includes code constraint violations that include patterns of all ones, all zeroes and alternating ones and zeroes.

16. The method of claim 1 wherein each data block includes w-bit data symbols and one or more of the data symbols include code constraint violating symbols having code constraint violating bit sequences of w bits.

17. The method of claim 16 wherein the linked list includes a forward list.

18. The method of claim 17 wherein replacing comprises:
replacing each of the code constraint violating symbols in the data stream with a pointer value, all but a last one of the replacement pointer values pointing forwards to a location of a next one of the code constraint violating symbols occurring later in the data stream and the last one the replacement pointer values comprising an end-of-list marker; and
providing a head pointer value to point to a first one of the replacement pointer values.

19. The method of claim 18 wherein the head pointer value is prepended to a first of the data symbols in the data block.

20. The method of claim 16 wherein the linked list includes a reverse list.

21. The method of claim 20 wherein replacing comprises:
replacing each of the code constraint violating symbols in the data stream with a pointer value, all but a last one of the replacement pointer values pointing backwards to a location of a next one of the code constraint violating bit sequences occurring earlier in the data stream and a last one the replacement pointer values comprising an end-of-list marker; and
providing a head pointer value to point to a first one of the replacement pointer values.

22. The method of claim 21 wherein the head pointer value is appended to a last of the data symbols in the data block.

23. The method of claim 16 wherein each data block includes w-bit data symbols and one or more of the data symbols include code constraint violating symbols having code constraint violating bit sequences of $m \leq w$ bits.

24. A method of decoding a codeword comprising:
receiving a codeword that includes a linked list of pointer values each associated with a pattern of code constraint violation; and
parsing the codeword, removing a first one of the pointer values and replacing each subsequent pointer value with the pattern of code constraint violation with which such pointer value is associated.

25. A method of processing data comprising:
encoding a block of data by modifying the data block to produce a codeword which includes a linked list of pointer values, each of the pointer values being associated with a pattern of code constraint violation; and
decoding the data block by parsing the codeword, removing a first one of the pointer values and replacing each subsequent pointer value with the pattern of code constraint violation with which such pointer value is associated.

26. An article comprising:
a storage medium having stored thereon instructions that when executed by a machine result in the following:
receiving blocks of data in an unconstrained data stream; and
producing a constrained data stream to satisfy a code constraint by replacing code constraint violating bit sequences occurring in each data block with values that include pointer values to form a linked list in such data block.

27. A system comprising:
a data channel;
an encoder unit, connected to the data channel, including a modulation encoder followed by an error correction code (ECC) encoder; and
the modulation encoder being configured to receive blocks of data in an unconstrained data stream, and to produce a constrained data stream to satisfy a code constraint of the data channel by replacing code constraint violating bit sequences occurring in each data block with values that include non-code-constraint-violating pointer values to form a linked list in such data block.

28. The system of claim 27 wherein the replaced code constraint violating sequences of bits include at least one type of violation of the code constraint.

29. The system of claim 28 wherein the code constraint includes a k constraint.

* * * * *